Figure 1:
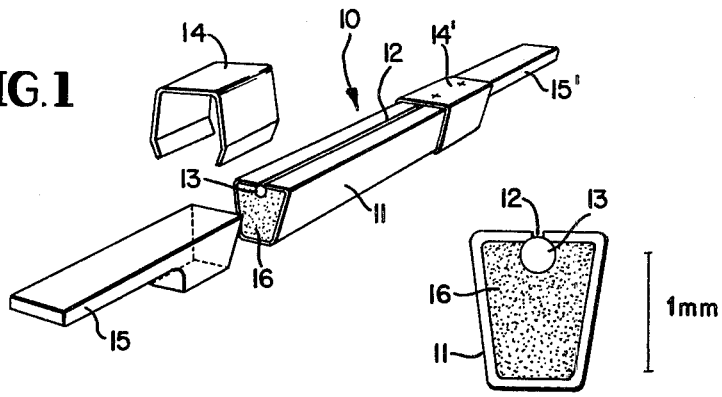

United States Patent [19]

Hellier

[11] 4,195,891

[45] Apr. 1, 1980

[54] ALKALI METAL VAPOR GENERATOR

[75] Inventor: Stephen J. Hellier, Milan, Italy

[73] Assignee: S.A.E.S. Getters S.p.A., Milan, Italy

[21] Appl. No.: 885,454

[22] Filed: Mar. 10, 1978

[30] Foreign Application Priority Data

Mar. 14, 1977 [IT] Italy .............................. 21182 A/77

[51] Int. Cl.² ........................... H01B 1/02; H01J 9/22
[52] U.S. Cl. ........................................ 316/5; 252/512;
252/514; 252/518; 316/12; 316/30; 313/179
[58] Field of Search ............ 252/512, 514, 518, 181.4,
252/181.7; 313/174, 179; 423/289, 344; 316/5,
12

[56] References Cited

U.S. PATENT DOCUMENTS

| 3,667,513 | 6/1972 | Della Porta et al. ............ 313/174 X |
| 3,945,949 | 3/1976 | Van Vocht et al. ................. 252/514 |

*Primary Examiner*—Benjamin R. Padgett
*Assistant Examiner*—E. Suzanne Parr
*Attorney, Agent, or Firm*—Quaintance, Murphy & Richardson

[57] ABSTRACT

For the introduction of an alkali metal vapor into an electron discharge lamp or an electron discharge tube, in particular for the vapor deposition of surfaces for photo-emission or secondary electron emission in such a tube, generators are used with a filling which comprises at least one alkali metal as a compound with either boron or silicon. Such filling can be mixed with additional metals.

10 Claims, 10 Drawing Figures

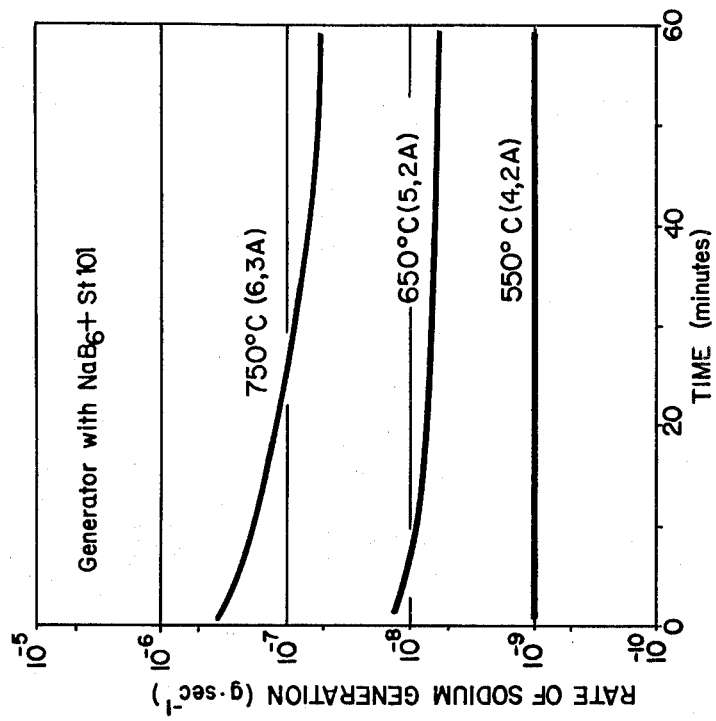
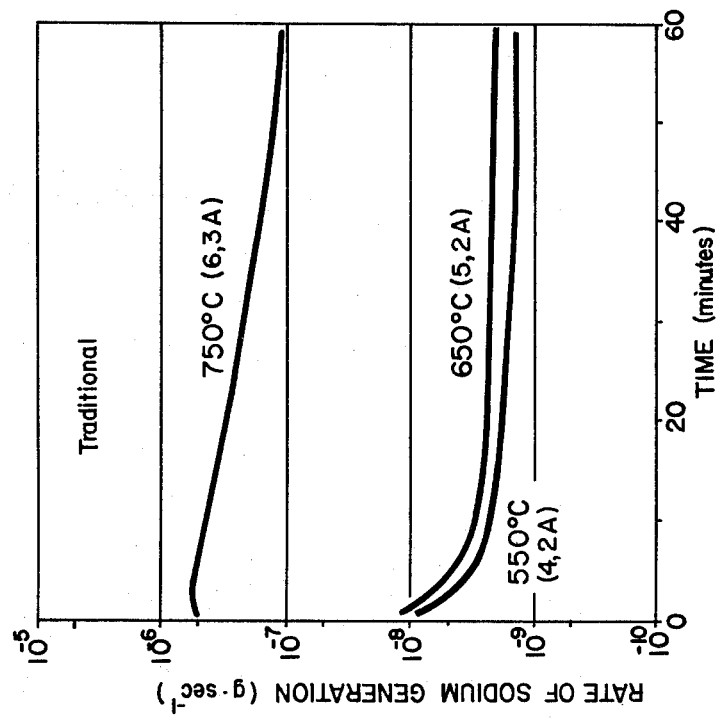

ALKALI METAL VAPOR GENERATOR

BACKGROUND OF THE INVENTION

Alkali metal generators are well known in the art. Such generators are described, for example, in U.S. Pat. No. 3,667,513 and consist of a metal holder which contains a mixture of a chromate or a bichromate of the relevant alkali metal and a reducing agent for said chromate or bichromate. A drawback of chromate-metal mixtures is that they have non-reproducible evaporation properties after storage in air.

Another disadvantage is that, when the exothermic reaction between the components of the said chromate-reducing agent mixtures have started, the temperature and the reaction rate are difficult to control. This means that the rate of evaporation of alkali metal is also difficult to control. It will be obvious that the said drawbacks constitute an impedance for the provision in a reproducible manner of surfaces for photo-emission or secondary electron emission. If the generator has to be used in an alkali metal discharge lamp it is also difficult to control the total quantity of alkali metal evaporated.

In an attempt to reduce the disadvantages of the use of alkali metal chromate salts U.S. Pat. No. 3,658,713 proposes the use of niobium as a reducing agent. It is therein claimed that alkali metal release occurs at low temperatures and that greater alkali metal yields are possible using niobium than those obtained when using silicon or zirconium or other reducing agents. However, it has been found that the alkali metal released when using niobium as a reducing agent is not all released as pure alkali metal as will be explained in detail later.

Furthermore, these alkali metal vapour generators still use alkali metal chromates or bichromates. These materials are well known to be carcinogenic.

In a further attempt to overcome the disadvantages of previous alkali metal vapour generators there has been proposed in U.S. Pat. No. 3,945,949 the use of a generator having a filling which consists of at least one alkali metal alloyed with gold and/or silver, and/or copper alloyed with gold or silver. These alkali metal-gold alloys do not require the use of a reducing agent, however gold and silver are very expensive and their price is subject to considerable day-to-day fluctuation.

It is therefore an object of the present invention to provide an alkali metal vapour generator which is free from one or more of the disadvantages of prior alkali metal vapour generators.

A further object of the present invention is to provide an alkali metal vapour generator which is capable of being stored in air without deterioration.

It is yet another object of the present invention to provide an alkali metal vapour generator which is capable of generating alkali metal vapours without the need of a reducing agent.

It is yet another object of the present invention to provide an alkali metal vapour generator which does not require the use of expensive additional materials.

It is yet another object of the present invention to provide an alkali metal vapour generator whose rate of vapour generation varies in a uniform manner with temperature.

It is yet another object of the present invention to provide an alkali metal vapour generator suitable for automatic control of the rate of vapour generation.

According to the present invention, there is provided an alkali metal vapour generator comprising a holder and a material carried by the holder, said material being selected from the group consisting of alkali metal borides and alkali metal silicides. The material carried by the holder is of the formula $AM_x$, wherein A is selected from the group consisting of sodium, potassium and caesium, M is selected from the group consisting of boron and silicon, and x is from 1 to 40.

Representative species of alkali metal vapour releasing materials are $NaB_6$, $NaB_{16}$, $KB_6$, $NaSi$, $NaSi_2$, $Na_8Si_{46}$, $KSi$, $KSi_6$, $K_{6-8}Si_{46}$, $CsSi$, $CsSi_8$. These compounds are described in Hansen, "Constitution of Binary Alloys" (McGraw Hill, New York, 1958, 1969) and in "The Alkali Metals", Special Publication No. 22 of The Chemical Society, (Burlington House, London, W.1., (1967), p. 207-221 and p. 104).

Preferred examples of such materials are $NaB_6$, $KB_6$, $K_{6-8}Si_{46}$ and Cs-B compositions where the atomic ratio of caesium to boron is from 1:20 to 1:40. By the formula $K_{6-8}Si_{46}$ it is meant that the theoretical stoichiometric compound is $K_8Si_{46}$ but in practice the actual compound produced is $K_6Si_{46}$. It has surprisingly been found that when the alkali metal chromate and reducing agent of a traditional alkali metal generator are replaced by alkali metal vapour generating materials of the present invention that the power required to increase the temperature of the generator to a given value is less. It has also been found that at the usual operating temperature of the generator a larger amount of alkali metal is released. This is in spite of the fact that in the publication "The Alkali Metals," supra, it is stated that the hexaboride of sodium is stable under high vacuum ($10^{-6}$ Torr) up to 650° C. and that of potassium up to 750° C. Furthermore, it is stated that at 1,000° C. in argon it requires a total time of 20 hours for $NaB_6$ to release approximately one-half of its sodium content.

Furthermore, it has been found with alkali metal generators of the present invention that the rate of release of alkali metal increases in a uniform manner with temperature over the temperature range of practical use of about 500°-750° C. This is in sharp contrast with the characteristics of traditional generators using alkali metal chromates or bichromates. Such a uniform variation of evaporation rate with temperature means that close control of alkali metal evaporation can be exercised by means of automatic equipment.

Various methods are known for releasing alkali metal vapours from alkali metal generators. For the release of alkali metal vapours in electric discharge lamps, it is preferable to place the alkali metal generating material into a U-shaped ring channel holder. The alkali metal releasing material is preferably mixed with a metal binder to ensure retention of the alkali metal releasing material within the ring holder. The metal binder may be selected from the group consisting of nickel, zirconium, niobium, aluminium and alloys thereof. Alloys include such alloys as zirconium-aluminium alloys and intermetallic compounds such as $Zr_2Ni$. In this application, it is desirable to release as much alkali metal as possible in relatively short times, such as about 60 seconds. It is therefore necessary to heat the ring dispenser to high temperatures of about 900° to 1,100° C.

When the alkali metal vapour generator is to be used for a vapour deposition of surfaces for photo emission or secondary electron emission the alkali metal vapour generating material is preferably contained within a relatively long tubular container as described in U.S. Pat. No. 3,958,384.

A representative process for introducing an alkali metal vapour into an electron discharge tube comprises the steps of:

I. inserting into the electron tube a holder containing a material selected from the group consisting of alkali metal borides and alkali metal silicides, and then II. heating the material to liberate the alkali metal vapour.

In order that the invention may be readily carried into effect, embodiments thereof will now be described with reference to the accompanying drawings wherein, FIG. 1 is a partially exploded view and cross section of an alkali metal vapour generator comprising a holder and an alkali metal vapour generating material of the present invention.

Figure 2:
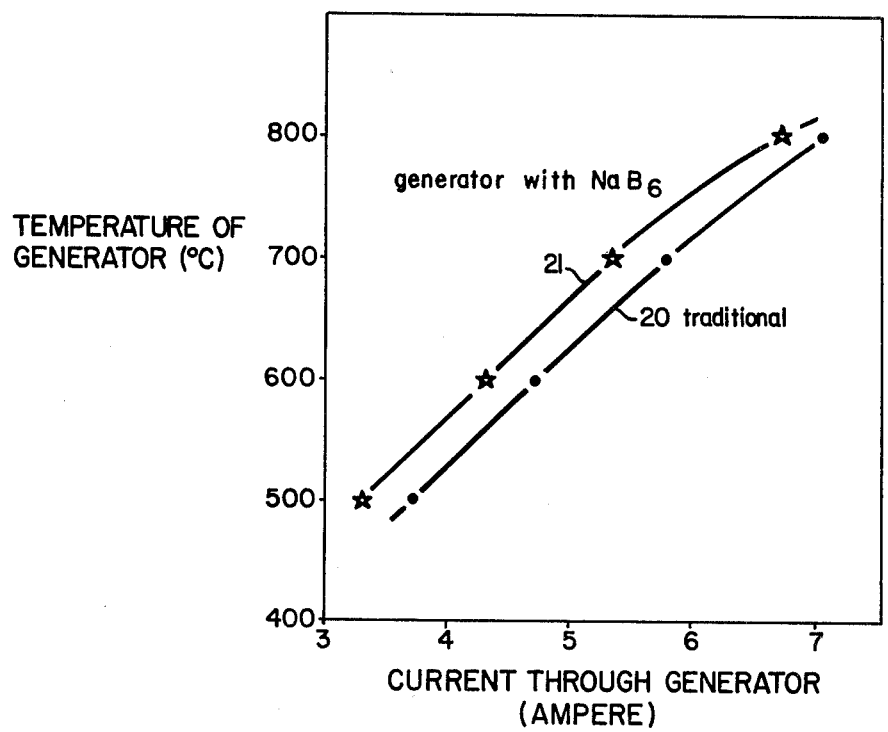

FIG. 2 compares various properties of a generator of the present invention with the properties of a traditional generator.

Figure 3:
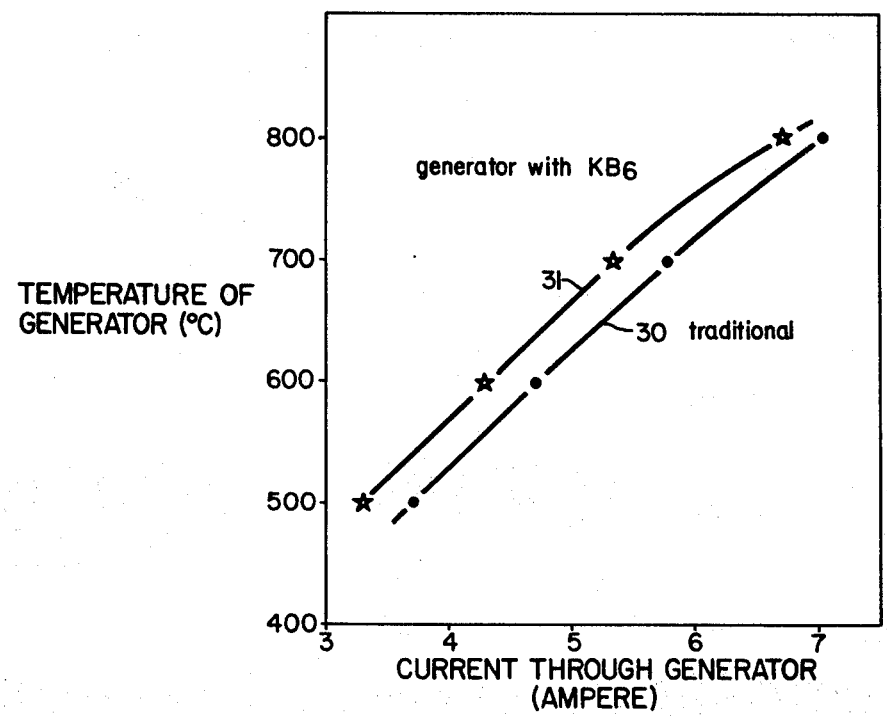

FIG. 3 compares the properties of another generator of the present invention with the properties of a traditional generator.

Figure 4:
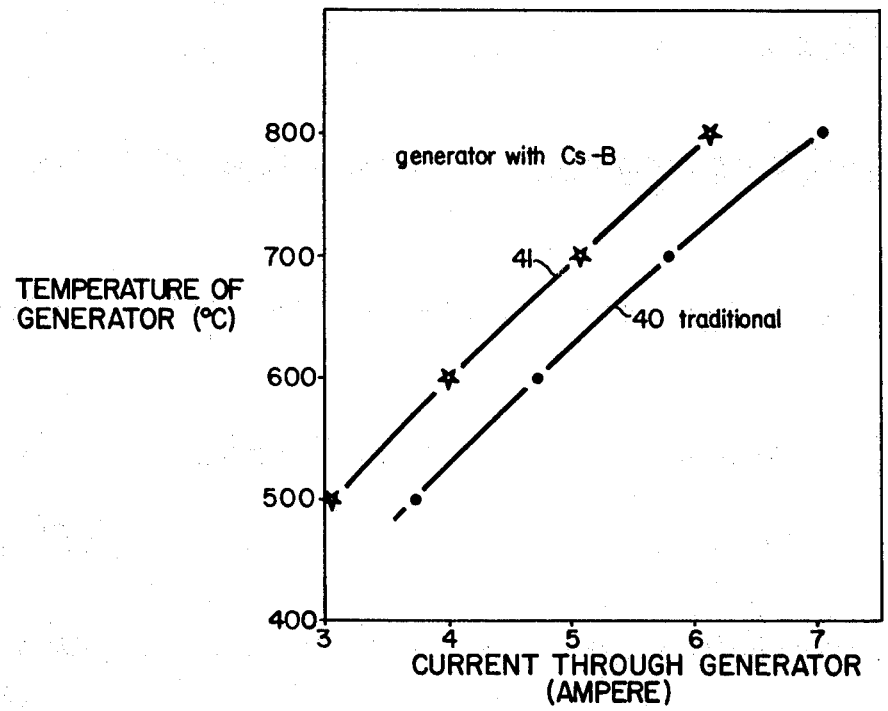

FIG. 4 compares the properties of yet another generator of the present invention with the properties of a traditional generator.

Figure 5:
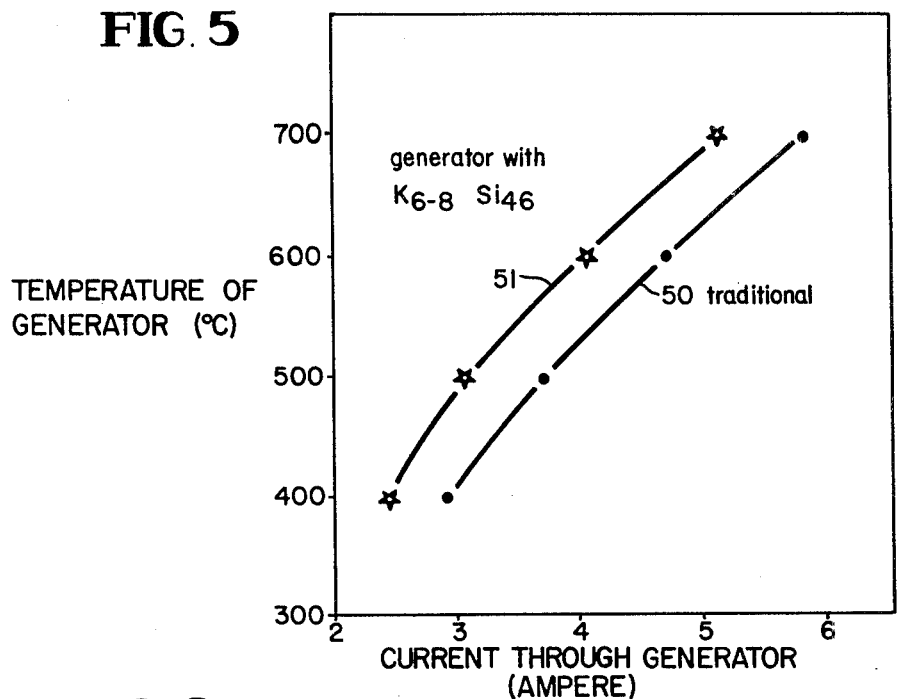

FIG. 5 compares the properties of yet a further generator of the present invention with the properties of a traditional generator.

Figure 6B:
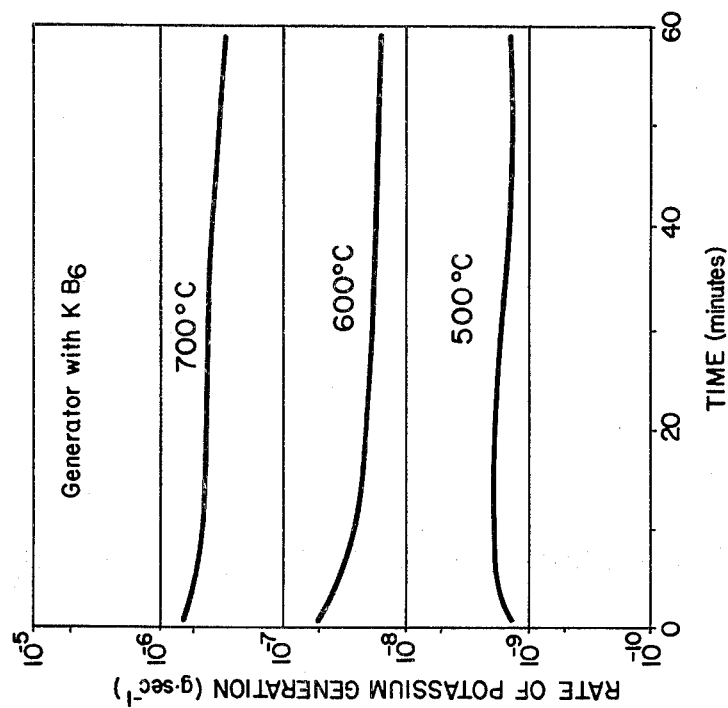
Figure 6A:
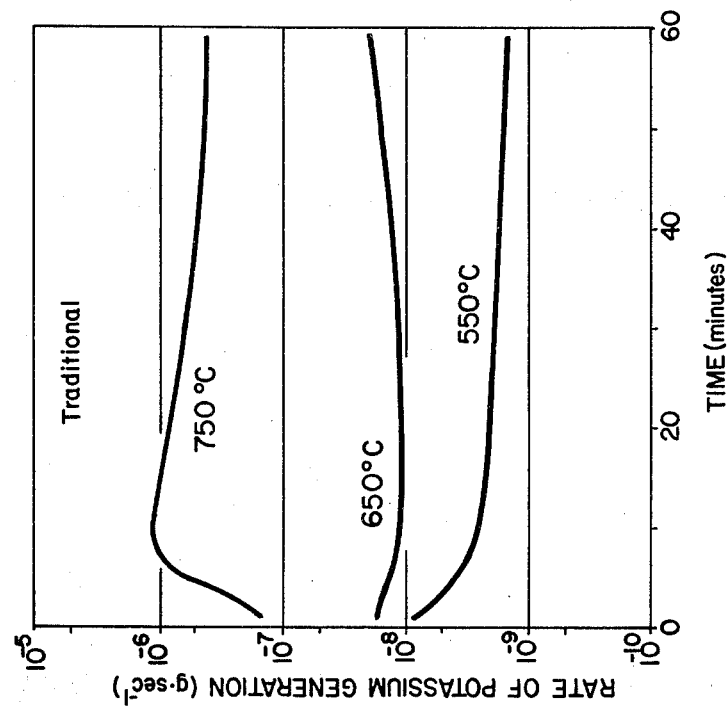

FIGS. 6a and 6b compare the time, temperature and evaporation rate characteristics of a traditional generator and a generator of the present invention.

FIGS. 7a and 7b compare the time, temperature and evaporation rate characteristics of another generator of the present invention with those of a traditional generator.

Figure 8:
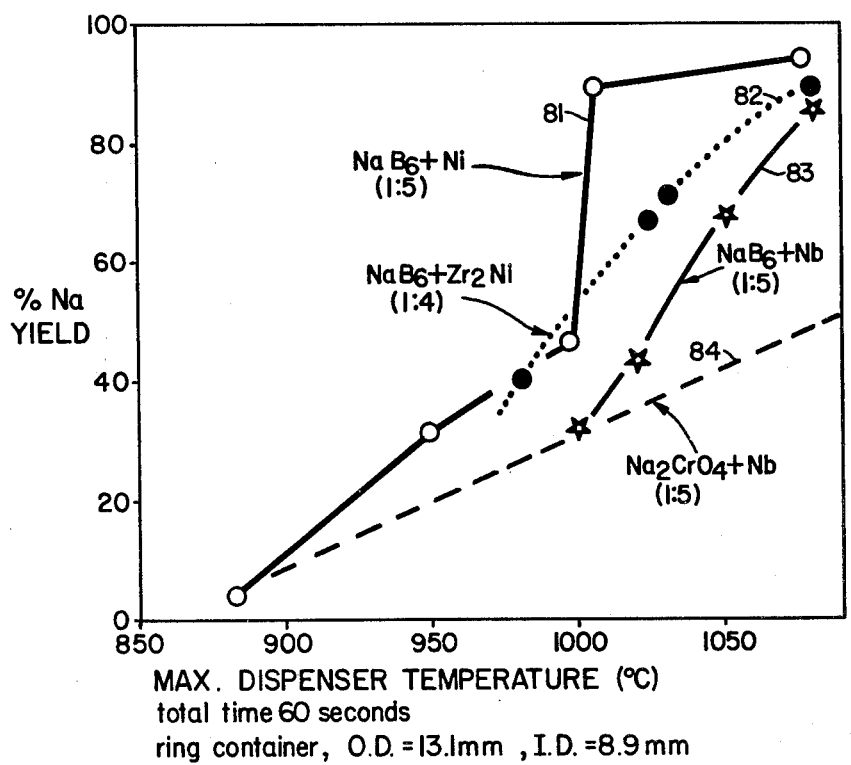

FIG. 8 compares the sodium yield characteristics of dispensers of the present invention with those of previous dispensers when used for dispensing alkali metal vapours in an alkali metal discharge lamp.

EXAMPLES

Referring now to the drawings and in particular to FIG. 1, there is shown an alkali metal vapour generator 10 of known construction comprising a trapezoidal container 11 furnished with a slit 12 for the release of alkali metal vapours and a wire 13 which prevents the escape of loose particles through the slit 12. Each end of trapezoidal container 11 is attached by means of wrapping bands 14, 14' to terminals 15, 15'. Trapezoidal container 11 is furthermore filled with an alkali metal vapour generating material 16. The cross sectional area of the trapezoidal container is approximately 1 mm square.

EXAMPLE I

FIG. 2 shows curve 20 which indicates the temperature reached by a traditional generator as a function of the electric current passed through the generator. By "traditional generator" is meant a generator as shown in FIG. 1 whose trapezoidal container is 25 mm long and the alkali metal vapour generating material is a mixture of sodium chromate and reducing agent (an alloy of 84% zirconium with 16% aluminium) available from SAES Getters S.p.A, Milan, Italy, with catalogue No. NF/25/T. Curve 21 represents the same relationship for a generator of the present invention identical in all respect to the generator used for obtaining curve 20 except that the alkali metal vapour generating material was replaced with sodium hexaboride. Examination of curves 20 and 21 shows that for any given temperature less current is required by a generator of the present invention.

Table I compares the amount of metallic sodium released from generators identical to those used to obtain FIG. 2, when held at different temperatures for one hour.

TABLE I

| Temperature °C. | Na yield (mg) of 25 mm long generators after 1 hour heating | |
|---|---|---|
| | Traditional | $NaB_6$ |
| 500 | not detectable | 0.03 |
| 600 | 0.03 | 0.36 |
| 700 | 0.18 | 1.16 |
| 800 | 1.96 | 3.98 |

EXAMPLE II

The procedure of Example I was repeated using potassium chromate as the traditional generator and potassium hexaboride as the alkali metal vapour generator of the present invention. FIG. 3 shows a similar temperature/current relationship to that shown in FIG. 2 demonstrating that potassium hexaboride (curve 31) requires less current than potassium chromate (curve 30) to generate alkali metal vapour at a given temperature. Table II compares the yield of potassium when generators identical to those used to obtain FIG. 3 are held at different temperatures for one hour.

TABLE II

| Temperature °C. | K yield (mg) of 25 mm long generators after 1 hour heating | |
|---|---|---|
| | Traditional | $KB_6$ |
| 500 | not detectable | not detectable |
| 600 | 0.02 | 0.08 |
| 700 | 0.1 | 1.43 |
| 800 | 2.6 | 3.46 |

EXAMPLE III

The procedure of Example I was repeated using caesium chromate as the traditional alkali metal vapour generator and a caesium boride as the generator of the present invention. The caesium boride was produced in the following manner. Amorphous boron of less than 1 micron in diameter, and purity of 99.99% was degassed at $10^{-6}$ torr. and 700° C. for two hours. Two parts by weight of boron was mixed with one part by weight of caesium of 99.98% purity. The mixture was placed in a stainless steel crucible of internal diameter 15 mm, external diamter 25 mm and length 100 mm. The crucible was soldered in an argon atmosphere, and heated for 8 days at 800° C. Excess caesium was removed from the product by distillation at $10^{-6}$ torr. and 580° C. for 2 hours. The caesium boride produced was stable in air and was used in this Example. If the crucible is only heated at 600° C. for 8 days the product is unstable in air. The caesium boride used had a composition of approximately 27.5 weight % caesium such that the atomic ratio of caesium to boron is about 1:32. FIG. 4 is similar to FIG. 2 with curve 40 showing the discharge of alkali metal vapour from a caesium chromate generator and curve 41 showing the discharge from a caesium boride generator. Table III is similar to Table I using these compounds instead of those of Example I.

TABLE III

| Temperature | Cs yield (mg) of 25 mm long generators after 1 hour heating | |
| --- | --- | --- |
| °C. | Traditional | Cs—B |
| 500 | not detectable | 0.24 |
| 600 | 0.27 | 1.96 |
| 700 | 4.62 | 3.80 |
| 800 | 10.68 | 6.31 |

EXAMPLE IV

The procedure of Example I was repeated using potassium chromate as the traditional alkali metal vapour generator and $K_{6-8}Si_{46}$ as the generator of the present invention. FIG. 5 is similar to FIG. 2 with curve 50 representing a potassium chromate generator and curve 51 representing a $K_{6-8}Si_{46}$ generator. Table IV is similar to Table I using these compounds instead of those of Example I.

TABLE IV

| Temperature | K yield (mg) of 25 mm long generators after 1 hour heating | |
| --- | --- | --- |
| °C. | Traditional | $K_{6-8}Si_{46}$ |
| 400 | not detectable | not detectable |
| 500 | — | 0.03 |
| 600 | 0.02 | 1.31 |
| 700 | 0.1 | 5.74 |

Examples I-IV show that for any given temperature less current is required to generate alkali metal vapour by a generator of the present invention than by a traditional chromate generator, and that when given temperatures are held for an hour more alkali metal vapour is generated by these generators than by traditional ones.

FIG. 6a shows, for a traditional generator identical in all respects to the generator used to obtain FIG. 3 curve 30, the rate of emission of metallic potassium as a function of time at three different temperatures.

FIG. 6b shows that when the potassium chromate-reducing agent mixture of a traditional generator is replaced by potassium hexaboride then the same evaporation rate is attained approximately 50° C. lower. Furthermore, the generators of the present invention show a much more linear rate of evaporation with time. In addition, the increase in rate of alkali metal generation is a more even function of temperature.

FIG. 7a shows, for a traditional getter identical in all respects to the generator used to obtain curve 20 on FIG. 2, the rate of sodium generation as a function of time at three different temperatures.

FIG. 7b shows that when the sodium chromate-reducing agent mixture of a traditional generator is replaced by an alkali metal (in this case sodium) hexaboride mixed with an additional metal (in this case an alloy of 84% zirconium with 16% aluminium) the rate of generation of alkali metal is, at a given temperature, higher only over a limited temperature range. However, in the case of generator of the present invention the increase in rate of alkali metal generation is a much more uniform function of temperature.

FIG. 8 shows the percentage sodium yield obtained from various dispensers in a total time of 60 seconds when each generator is heated to a maximum given temperature with high frequency induction heating. In each case the holder was in the form of a U-shaped cross section ring channel. In this case, it was found necessary to mix the alkali metal hexaboride with another metal to act as a binder thus holding the hexaboride within the U-channel. Curves 81, 82 and 83 show the yields obtained when the sodium hexaboride is mixed respectively with nickel, $Zr_2Ni$ and niobium in the weight ratios indicated on FIG. 8. Curve 84 shows the sodium yield obtained when an identical ring holder contains alkali metal generating compositions described in U.S. Pat. No. 3,658,713. It is seen that higher percentage alkali metal yields are obtained with alkali metal vapour generators of the present invention.

Although the invention has been described in considerable detail with reference to said preferred embodiments designed to teach those skilled in the art how best to practice the invention, it will be realized that other modifications may be employed without departing from the spirit and the scope of the appended claims.

What is claimed is:

1. An alkali metal vapour generator comprising a holder and a material carried by the holder, said material being of the formula $AM_x$, wherein A is selected from the group consisting of sodium, potassium and caesium, M is selected from the group consisting of boron and silicon, and x is from 1 to 40.

2. An alkali metal vapour generator of claim 1 comprising a holder and $K_{6-8}Si_{46}$ carried by the holder.

3. An alkali metal vapour generator of claim 1 comprising a holder and $NaB_6$ carried by the holder.

4. An alkali metal vapour generator of claim 1 comprising a holder and $KB_6$ carried by the holder.

5. An alkali metal vapour generator of claim 1 comprising a holder and a Cs-B composition where the atomic ratio of caesium to boron is from 1:20 to 1:40.

6. An alkali metal vapour generator of claim 1 comprising a holder and a Cs-B composition where the atomic ratio of caesium to boron is 1:32.

7. An alkali metal vapour generator comprising a holder and a material carried by the holder, said material being of the formula $AM_x$, wherein A is selected from the group consisting of sodium potassium and caesium, M is selected from the group consisting of boron and silicon, and x is from 1 to 40 and wherein said material is in admixture with a metal binder which is selected from the group consisting of nickel, zirconium, niobium, aluminium, and alloys thereof.

8. An alkali metal vapour generator of claim 7 comprising a holder containing a material consisting essentially of $NaB_6$ and an alloy of 84% zirconium with 16% aluminium.

9. An evacuated vessel containing an alkali metal vapour generator of claim 7.

10. A process for introducing an alkali metal vapour into an electron discharge tube comprising the steps of:
  I. inserting into the electron discharge tube a holder containing a material, said material being of the formula $AM_x$, wherein A is selected from the group consisting of sodium, potassium and caesium, M is selected from the group consisting of boron and silicon, and x is from 1 to 40
  and then
  II. heating the material to liberate alkali metal vapour.

* * * * *